United States Patent
Dang et al.

(10) Patent No.: US 9,196,383 B2
(45) Date of Patent: Nov. 24, 2015

(54) SCALABLE PREDICTION FAILURE ANALYSIS FOR MEMORY USED IN MODERN COMPUTERS

(71) Applicant: International Business Machines Corporation, Armonk, NY (US)

(72) Inventors: Tu T. Dang, Cary, NC (US); Michael C. Elles, Apex, NC (US); Juan Q. Hernandez, Garner, NC (US); Dwayne A. Lowe, Durham, NC (US); Challis L. Purrington, Sr., Fuquay Varina, NC (US)

(73) Assignee: International Business Machines Corporation, Armonk, NY (US)

(*) Notice: Subject to any disclaimer, the term of this patent is extended or adjusted under 35 U.S.C. 154(b) by 163 days.

(21) Appl. No.: 14/011,222

(22) Filed: Aug. 27, 2013

(65) Prior Publication Data

US 2014/0013170 A1    Jan. 9, 2014

Related U.S. Application Data

(63) Continuation of application No. 12/912,735, filed on Oct. 26, 2010, now abandoned.

(51) Int. Cl.

| | |
|---|---|
| *G06F 11/00* | (2006.01) |
| *G11C 29/42* | (2006.01) |
| *G06F 11/07* | (2006.01) |
| *G06F 11/10* | (2006.01) |
| *G11C 29/50* | (2006.01) |
| *G11C 29/04* | (2006.01) |

(52) U.S. Cl.
CPC .............. *G11C 29/42* (2013.01); *G06F 11/076* (2013.01); *G06F 11/0754* (2013.01); *G06F 11/1048* (2013.01); *G11C 29/50004* (2013.01); *G06F 2201/81* (2013.01); *G11C 2029/0409* (2013.01)

(58) Field of Classification Search
None
See application file for complete search history.

(56) References Cited

U.S. PATENT DOCUMENTS 5,959,537 A * 9/1999 Banting et al. ................ 340/664
7,328,376 B2 * 2/2008 McGuire et al. ................ 714/48
(Continued)

FOREIGN PATENT DOCUMENTS

| CN | 101266840 A | 9/2008 |
|---|---|---|
| KR | 2007017749 A | 2/2007 |

OTHER PUBLICATIONS

"Determination of Excessive Single-Bit Errors", NN9409267, Sep. 1, 1994, IBM Technical Disclosure Bulletin, Vo. 37, iss 9, p. 267-270.*

(Continued)

*Primary Examiner* — Gabriel Chu
(74) *Attorney, Agent, or Firm* — Noah A. Sharkan; Mark C. Vallone

(57) ABSTRACT

One embodiment provides a method for scalable predictive failure analysis. Embodiments of the method may include gathering memory information for memory on a user computer system having at least one processor. Further, the method includes selecting one or more memory-related parameters. Further still, the method includes calculating based on the gathering and the selecting, a single bit error value for the scalable predictive failure analysis through calculations for each of the one or more memory-related parameters that utilize the memory information. Yet further, the method includes setting, based on the calculating, the single bit error value for the user computer system.

17 Claims, 4 Drawing Sheets

(56) References Cited

U.S. PATENT DOCUMENTS

| | | | |
|---|---|---|---|
| 7,474,989 B1 | 1/2009 | Wilcoxon | |
| 8,074,062 B2* | 12/2011 | Yang et al. | 713/1 |
| 2004/0215912 A1* | 10/2004 | Vergis et al. | 711/170 |
| 2006/0101308 A1* | 5/2006 | Agarwal et al. | 714/25 |
| 2006/0206764 A1 | 9/2006 | Lu et al. | |
| 2007/0006048 A1* | 1/2007 | Zimmer et al. | 714/42 |
| 2008/0086275 A1 | 4/2008 | Astigarraga et al. | |
| 2010/0306598 A1* | 12/2010 | Ackaret et al. | 714/47 |
| 2011/0231697 A1* | 9/2011 | Berke et al. | 714/3 |
| 2012/0079314 A1* | 3/2012 | Kamath et al. | 714/6.1 |

OTHER PUBLICATIONS

Tsujide, et al., "Automatic Memory Failure Analysis Using an Expert System in Conjunction with a Memory Tester/Analyzer", http://ieeexplore.ieee.org/stamp/stamp.jsp?arnumber=283326, 1993.

Singh, et al., "Software Based In-System Memory Test for Highly Available Systems", http://ieeexplore.ieee.org/stamp/stamp.jsp?amumber=1498209, 2005.

U.S. Appl. No. 12/912,735, entitled "Scalable Prediction Failure Analysis for Memory Used in Modern Computers" filed Oct. 26, 2010.

\* cited by examiner

SCALABLE PREDICTION FAILURE ANALYSIS FOR MEMORY USED IN MODERN COMPUTERS

RELATED APPLICATIONS

This application is a continuation of application Ser. No. 12/912,735, filed on Oct. 26, 2010, now pending.

BACKGROUND

Memory correctable errors are becoming a major issue in today's modern personal computers, especially since supported memory sizes often reach terabytes instead of gigabytes. To that end, complex predictive failure analyses are desirous in order to anticipate and prevent mild to catastrophic system failures involving data loss and damage due to memory errors.

BRIEF SUMMARY

One embodiment provides a method for scalable predictive failure analysis. Embodiments of the method may include gathering memory information for memory on a user computer system having at least one processor. Further, the method includes selecting one or more memory-related parameters from a plurality. Further still, the method includes calculating based on the gathering and the selecting, a single bit error value for the scalable predictive failure analysis through calculations for each of the one or more memory-related parameters that utilize the memory information. Yet further, the method includes setting, based on the calculating, the single bit error value for the user computer system.

Another embodiment provides a computer program product for scalable predictive failure analysis. The computer program product includes a computer readable storage device. Further, the computer program product includes first program instructions to gather memory information for memory on a user computer system having at least one processor. Further still, the computer program product includes second program instructions to select one or more memory-related parameters. Yet further, the computer program product includes third program instructions to calculate based on the gather and the select (i.e., performing the instructions to gather and to select), a single bit error value for the scalable predictive failure analysis through calculations for each of the one or more memory-related parameters that utilize the memory information. Still further, the computer program product includes fourth program instructions to set, based on the calculate (i.e., performing the instructions to calculate), the single bit error value for the user computer system, wherein the first, second, third, and fourth program instructions are stored on the computer readable storage device.

Another embodiment provides a system for scalable predictive failure analysis. The system includes a processor, a computer readable memory and a computer readable storage device. Further, the system includes first program instructions to gather memory information for memory on a user computer system having at least one processor, wherein the memory may be the same, part of or different from the computer readable memory. Further still, the system includes second program instructions to select one or more memory-related parameters. Yet further, the system includes third program instructions to calculate, based on the gather and the select, a single bit error value for the scalable predictive failure analysis through calculations for each of the one or more memory-related parameters that utilize the memory information. Further still, the system includes fourth program instructions to select, based on the calculate, the single bit error value for the user computer system. The first, second, third, and fourth program instructions of the system are stored on the computer readable storage device for execution by the processor via the computer readable memory.

BRIEF DESCRIPTION OF THE SEVERAL VIEWS OF THE DRAWINGS

So that the manner in which the above recited features, advantages and objects of the present disclosure are attained and can be understood in detail, a more particular description of this disclosure, briefly summarized above, may be had by reference to the embodiments thereof which are illustrated in the appended drawings.

It is to be noted, however, that the appended drawings illustrate only example embodiments of this disclosure, and, therefore, are not to be considered limiting of its scope, for this disclosure may admit or not to other equally effective embodiments.

DETAILED DESCRIPTION

Figure 1:
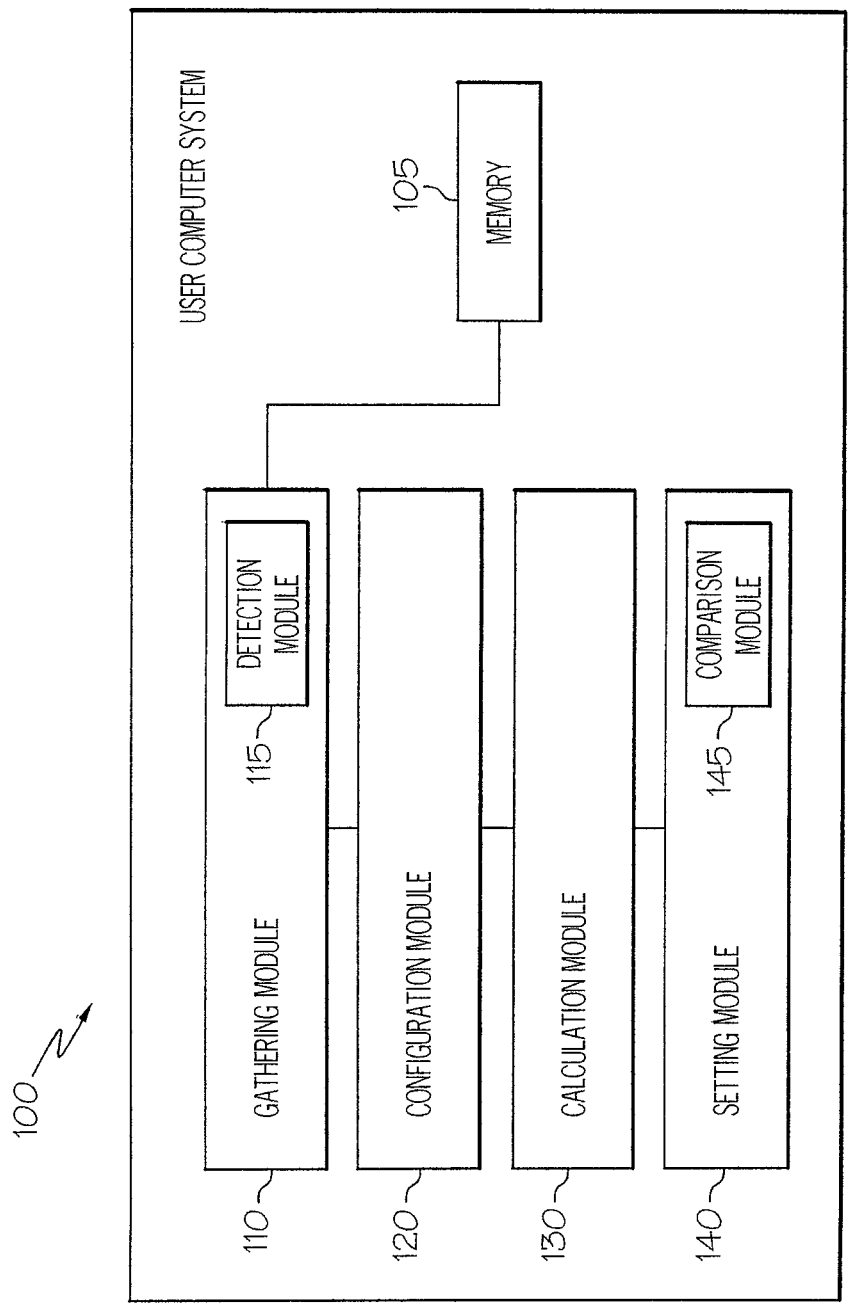
FIG. 1 depicts an example embodiment of a system for scalable predictive failure analysis in accordance with this disclosure.

The following is a detailed description of example embodiments with accompanying drawings. The example embodiments are in such detail as to communicate the invention. However, the amount of detail offered is not intended to limit the anticipated variations of embodiments; on the contrary, the intention is to cover all modifications, equivalents, and alternatives falling within the spirit and scope of the present invention as defined by the appended claims.

Generally speaking, systems, methods and media for scalable predictive failure analysis (SPFA) for single bit errors (SBE) in memory are disclosed. Embodiments include gathering, for a user computer system, memory information, such as memory size, synchronous dynamic random access memory (SDRAM) technology on the module, module packaging, memory failure mode and vendor quality. Calculation of the SBE value ensues through combining calculation(s) for each of the selected memory-related parameters, wherein the selecting optionally occurs subsequent or prior to the gathering. The calculated SBE value is set and valid for the user computer system until powering down or changing memory components in the user computer system. Accordingly, the SBE value is scalable because the value is determined for the particular user computer system—not simply a fixed, generic value. Alerts, whether audible or visible, may occur based on comparing counted SBEs to the scalable SBE value. The alerts provide credible predictive failure analysis to avert system memory failures while incorporating the realities of the unique complexities for the particular user computer system.

In general, the routines executed to implement the embodiments of the invention may be part of a specific application, component, program, module, object, or sequence of instructions. The computer program of the present invention typically is comprised of a multitude of instructions that will be translated by the native computer into a machine-readable format and hence executable instructions. Also, programs are comprised of variables and data structures that either reside locally to the program or are found in memory or on storage devices. In addition, various programs described herein may be identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

While specific embodiments will be described below with reference to particular configurations of hardware and/or software, those of skill in the art will realize that embodiments of the present invention may advantageously be implemented with other substantially equivalent hardware, software systems, manual operations, or any combination of any or all of these. The invention can take the form of an entirely hardware embodiment, an entirely software embodiment or an embodiment containing both hardware and software elements. In a preferred embodiment, the invention is implemented in software, which includes but is not limited to firmware, resident software, microcode, etc. Moreover, embodiments of the invention may also be implemented via parallel processing using a parallel computing architecture, such as one using multiple discrete systems (e.g., plurality of computers, etc.) or an internal multiprocessing architecture (e.g., a single system with parallel processing capabilities).

Any combination of one or more computer readable medium(s) may be utilized. The computer readable medium may be a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can store a program for use by or in connection with an instruction execution system, apparatus, or device. The term "computer-readable storage medium" does not encompass a signal propagation medium.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of embodiments of the invention described herein may be stored on computer-readable storage medium as well as distributed electronically over the Internet or over other networks, including wireless networks. Data structures and transmission of data (including wireless transmission) particular to aspects of the invention are also encompassed within the scope of the invention. Furthermore, the invention can take the form of a computer program product accessible from a computer-readable storage medium providing program code for use by or in connection with a computer or any instruction execution system. For the purposes of this description, a computer-usable or computer readable storage medium can be any apparatus that can store, the program for use by or in connection with the instruction execution system, apparatus, or device. The medium may be an electronic, magnetic, optical, electromagnetic, or semiconductor system (or apparatus or device). Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Each software program described herein may be operated on any type of data processing system, such as a personal computer, server, etc. A data processing system suitable for storing and/or executing program code may include at least one processor coupled directly or indirectly to memory elements through a system bus. The memory elements may include local memory employed during execution of the program code, bulk storage, and cache memories which provide temporary storage of at least some program code in order to reduce the number of times code must be retrieved from bulk storage during execution. Input/output (I/O) devices (including but not limited to keyboards, displays, pointing devices, etc.) may be coupled to the system either directly or through intervening I/O controllers. Network adapters may also be coupled to the system to enable the data processing system to become coupled to other data processing systems or remote printers or storage devices through intervening private or public networks, including wireless networks. Modems, cable modems and Ethernet cards are just a few of the currently available types of network adapters.

Turning now to the drawings, FIG. 1 depicts a user computer system 100 having a collection of cooperating, algorithmic modules for SPFA calculations. The enabling logic for modules 110, 115, 120, 130, 140, 145 is reduced to software and/or hardware. The modules 110, 115, 120, 130, 140, 145, are located, for example, within the operating system of a user computer system 100. In alternative example embodiments, any of the modules 110, 115, 120, 130, 140, 145 may be located remotely but in network communication with the user computer system 100. Example of remote location may have some of the modules 110, 115, 120, 130, 140, 145 located on other computer systems, including manipulations and calculations of the generated data being the subject of a Web service.

Regardless of individual logic location, the system 100 has accessible logic to gather memory information for memory 105 on the user computer system 100. The gathering module 110 gathers memory information, memory size, synchronous dynamic random access memory (SDRAM) technology on the module, module packaging, memory failure mode and vendor quality for memory 105 under test on the particular user computer system 100. For example, memory information for memory 105 could be a module size of 2 GB for a single-rank dual in-line module (DIMM). Below, further discussion of memory information occurs in combination with discussion of selected memory-based parameters.

The system 100 also includes logic, denominated as a configuration module 120 in FIG. 1, for selecting one or more memory-related parameters from a plurality of such parameters. A user or administrator, for example, of the user computer system 100 selects which memory-related parameters to include in the SPFA calculations. The selecting may occur through textual entry, radial selection, or other method for selecting options through a display coupled to the user computer system 100. The selected memory-related parameters, themselves, directly correlate to memory information. That is, memory information regarding memory size correlates to the memory-related parameter for memory size, memory information regarding module packaging correlates to the memory-related parameter for module packaging, and so forth.

In communication with both the gathering and configuration modules 110, 120, the calculation module 130 includes logic to calculate a combination of the selected memory-related parameters. The SPFA uses the selected number of memory-related parameters, which one considers critical to maintain a functioning memory subsystem, in order to calculate the SBE value. The setting module 140 then sets the calculated SBE value for the system 100. Evaluation of exemplary memory-related parameters and combination of the same for calculation of the SBE value now ensues.

Memory module size is a memory-related parameter for possible inclusion in the SPFA calculation for the memory 105. For such, the following exemplary scale is provided for a correctable SBE value based on the actual capacity of each module or module-pairs installed in the system:

TABLE 1

| Module Size | Scale Factor (n) | PFA threshold in time window |
|---|---|---|
| 2 GB | 1 | x |
| 4 GB | 2 | 2x |
| 8 GB | 4 | 4x |
| 16 GB | 8 | 8x |
| 32 GB | 16 | 16x |

Referring to Table 1, and assuming x=256 SBE for a baseline PFA count within a 24-hour window, then a larger memory 105 DIMM logically permits more SBEs before meeting or exceeding a set SBE value, i.e., a threshold. For example, the memory-based parameter for memory module size would allow 256 SBEs for a 2 GB DIMM, 512 SBEs for a 4 GB DIMM, 1024 SBEs for a 8 GB DIMM, 2048 SBEs for a 16 GB DIMM, and 4096 SBEs for a 32 GB DIMM before memory failure realized by visual and/or audio alert through use of the detection and comparison modules 115, 145.

In addition to memory module size, another possibly selected memory-related parameter for inclusion in the calculation of the SBE value is SDRAM technology on the memory module 105. For such, the following exemplary scale is provided:

TABLE 2

| Number of Rank | Scale Factor (m) | PFA threshold in time window |
|---|---|---|
| 1 (Single) | 1 | y |
| 2 (Dual) | 1.2 | y/1.2 |
| 4 (Quad) | 1.6 | y/1.6 |

Referring to Table 2, and assuming y=1024 for a baseline PFA count within a 24-hour window, memory 105 DIMM with a lesser rank permits a higher SBE value. For example, the memory-based parameter for SDRAM technology would allow 1024 SBEs for a single-rank DIMM, 823 SBEs for a dual-rank DIMM, and 640 SBEs for a quad-rank DIMM before alerting the user or another system in network communication with the system 100 of memory failure of a module or other memory device needing repair or replacement, whereupon the latter at least suggests a new SBE value should be re-set by re-calculation.

Still another memory-related parameter for inclusion in the calculation of the SBE value is module packaging of the memory 105 on the particular user computer system 100. For such, the following exemplary scale is provided:

TABLE 3

| SDRAM Data Width | Scale Factor (k) | PFA threshold in time window |
|---|---|---|
| x8 (with no IBM ® Chipkill ™ technology support) | 1 | z |
| x8 (with IBM ® Chipkill ™ support) | 2 | 2z |
| x4 (with IBM ® Chipkill ™ support) | 2.5 | 2.5z |

IBM® Chipkill™ is an advanced error checking and correcting (ECC) computer technology that has the ability to correct multi-bit memory errors on a single SDRAM. Referring to Table 3, and assuming z=256 for a baseline PFA count within a 24-hour window, memory 105 DIMM with additional advanced ECC protection, i.e., Chipkill™, affords a higher SBE value due to this individual PFA metric. For example, the memory-based parameter regarding Chipkill™ would allow 256 SBEs for x8 DIMM with no Chipkill™, 512 SBEs for x8 DIMM with Chipkill™ is, and 640 SBEs for x4 DIMM with Chipkill™.

Yet another memory-related parameter for optional inclusion in the calculation of the SBE value is memory failure mode of the memory 105 on the particular user computer system 100. Here, this memory-related parameter regards single count reduction for a single memory address. That is, a correctable SBE that occurs repeatedly at the same memory address on memory 105 DIMM is counted as one failure instead of counting the repeats as multiple failures.

Another example of a memory-related parameter for optional inclusion in the calculation of the SBE value is vendor quality of the memory 105 on the particular user computer system 100. For such, the following exemplary scale is provided:

TABLE 4

| Number of Rank | Scale Factor (m) |
|---|---|
| Vendor A, Product 1 | 1 |
| Vendor A, Product 2 | 0.8 |
| Vendor B, Product 1 | 1 |
| Vendor C, Product 1 | 0.5 |

Table 4 represents a memory vendor quality/reliability matrix on a per product basis. A memory vendor can have multiple products, each one could have a different quality/reliability rating. The quality scale rating, such as Table 4, may be used for calculating the SBE value. A memory 105 DIMM from a lower quality score supplier yields a lower PFA threshold value for this memory-related parameter. A lower quality score would require replacement or repair sooner as compared to a higher quality score provided all other contributing PFA memory-related parameters to the SBE value are constant.

For calculation purposes, combination of the selected, memory-related parameters may be through simple addition, multiplication, a mixture of the two, or any other combination method so as to yield a reliable, relative, and meaningful SBE value for SFPA. For example, the foregoing five memory-related parameters may calculate an SBE value according to: $PFA_{(sum)}=PFA_{(a)}+PFA_{(b)}+PFA_{(c)}+PFA_{(d)}+PFA_{(e)}$. The value of each memory-related PFA threshold and time window(s) should be defined by the subject matter expert on the system design team. That is, the illustrative tables provided herein are neither the sole nor necessarily appropriate values to use because the same are solely intended as examples. Whether a hardware built-in memory test, power-on memory test (i.e., post-power on self-test), system in run time, or memory diagnostic test, this disclosure enables a selectable and scalable PFA for memory 105 that thwarts consequences of memory failures for a particular user computer system 100.

Figure 2:
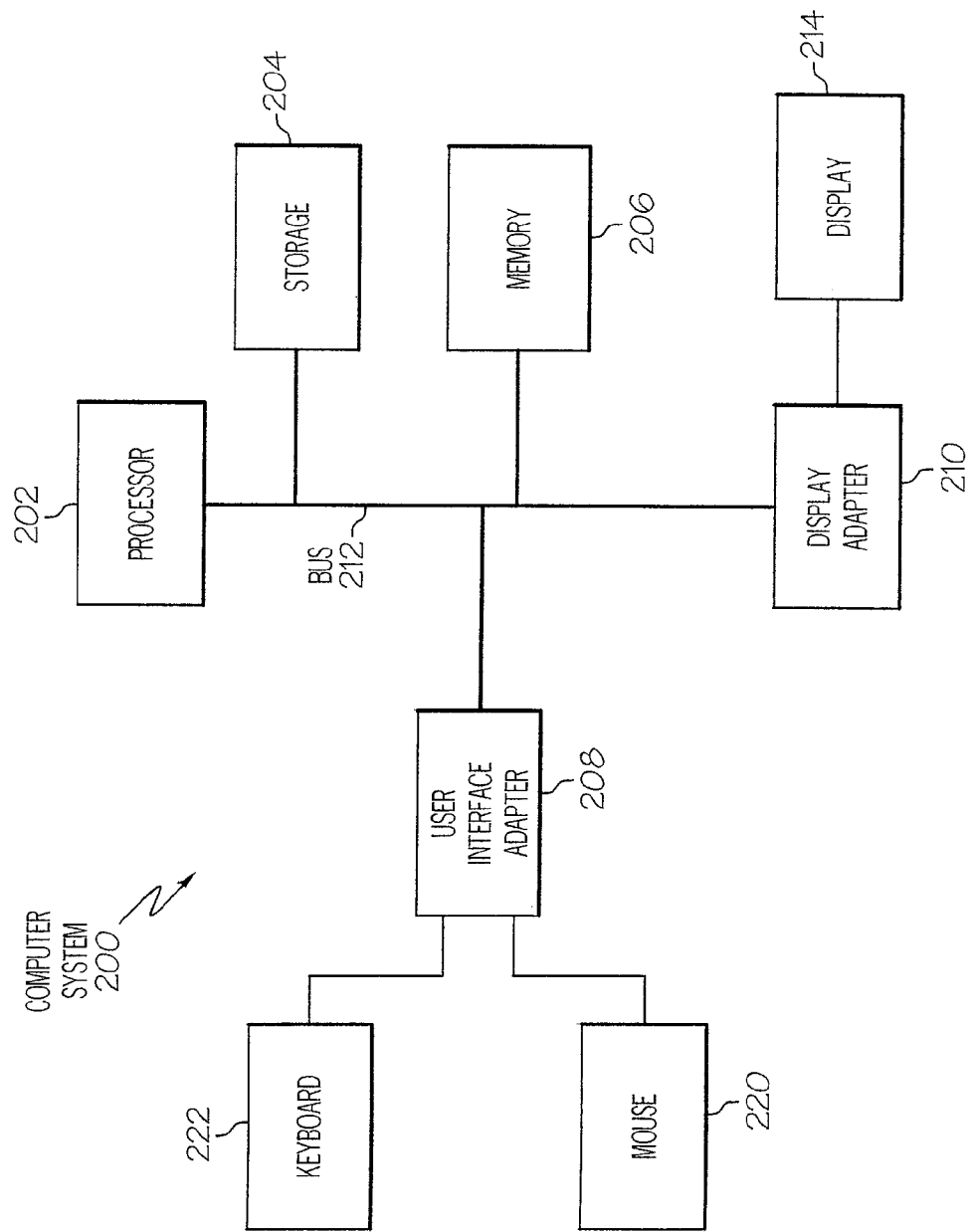
FIG. 2 depicts a block diagram of an example embodiment of a computer system suitable for scalable predictive failure analysis, such as a user computer system.

FIG. 2 depicts a block diagram of one embodiment of a computer system 200 suitable for use in scalable predictive failure analysis. Other possibilities for the computer system 200 are possible, including a computer having capabilities other than those ascribed herein and possibly beyond those capabilities, and they may, in other embodiments, be any combination of processing devices such as workstations, servers, mainframe computers, notebook or laptop computers, desktop computers, PDAs, mobile phones, wireless devices, set-top boxes, or the like. At least certain of the components of computer system 200 may be mounted on a multi-layer planar or motherboard (which may itself be mounted on the chassis) to provide a means for electrically interconnecting the components of the computer system 200.

In the depicted embodiment, the computer system 200 includes a processor 202, storage 204, memory 206, a user interface adapter 208, and a display adapter 210 connected to a bus 212 or other interconnect. The bus 212 facilitates communication between the processor 202 and other components of the computer system 200, as well as communication between components. Processor 202 may include one or more system central processing units (CPUs) or processors to execute instructions, such as an IBM® PowerPC® processor, an Intel® Pentium® processor, an Advanced Micro Devices, Inc. processor or any other suitable processor. IBM and PowerPC are trademarks of International Business Machines Corporation, registered in many jurisdictions worldwide. Intel and Pentium are trademarks or registered trademarks of Intel Corporation or its subsidiaries in the United States or other countries. The processor 202 may utilize storage 204, which may be non-volatile storage such as one or more hard drives, tape drives, diskette drives, CD-ROM drive, DVD-ROM drive, or the like. The processor 202 may also be connected to memory 206 via bus 212, such as via a memory controller hub (MCH). System memory 206 may include volatile memory such as random access memory (RAM) or double data rate (DDR) synchronous dynamic random access memory (SDRAM). In the disclosed systems, for example, a processor 202 may execute instructions to perform functions, such as by gathering memory information and selecting memory-related parameters for inclusion for SPFA calculations. Information before, during or after calculations may temporarily or permanently be stored in storage 204 or memory 206.

Figure 3:
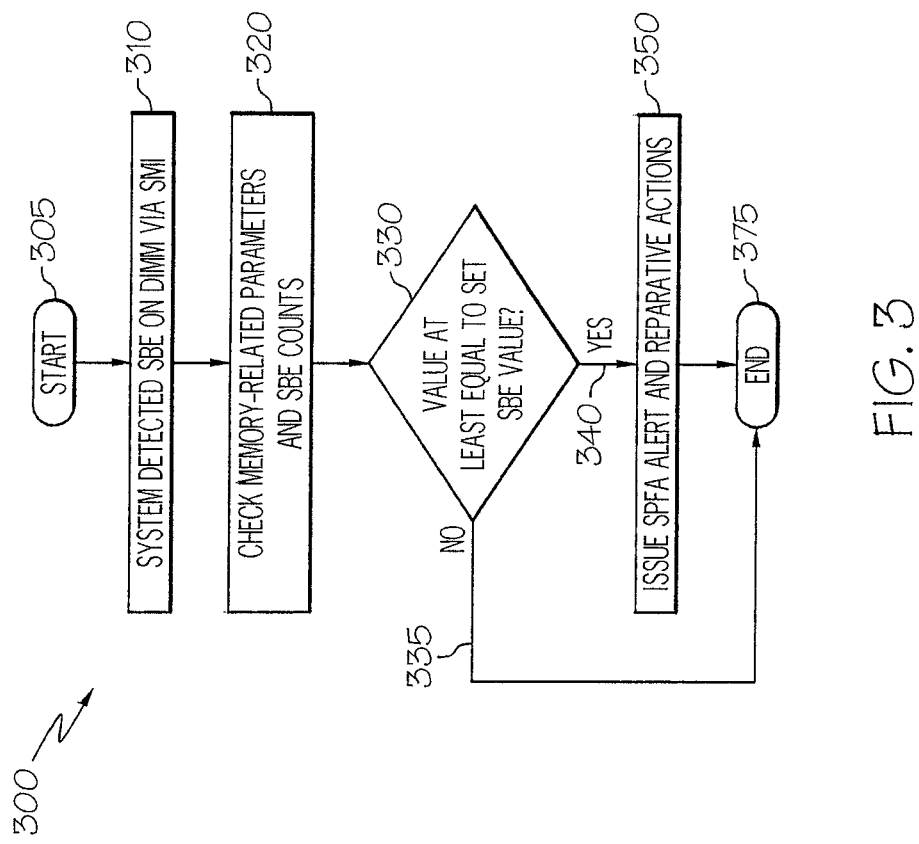
FIG. 3 depicts an example embodiment of a flowchart to show a method for scalable predictive failure analysis in accordance with this disclosure.

Turning now to FIG. 3, another aspect of scalable predictive failure analysis for memory associated with a particular user computer system is disclosed. At point is an example embodiment of a flowchart 300 for improved predictive failure analysis after having set the SBE value for the user computer system. Flowchart 300 is for a system, such as system 100, notably involving the logic associated with the detection and comparison modules 115, 145 of FIG. 1.

Returning to FIG. 3, flowchart 300 starts 305 by the system detecting 310 SBEs on a DIMM via a system management interrupt (SMI). When the user computer system boots, the BIOS or other BIOS implementation, such as Unified Extensible Firmware Interface (UEFI), interrupt factors are established. Upon the memory controller detecting 310 a SBE, SMI is triggered to notify wake up BIOS to check 320 the memory-related parameters and SBE counts accumulated so far. Decision block 330 queries whether the SBE count value is at least equal to set SBE value. If yes 340, then the flowchart 300 issues 350 an SPFA alert and optionally provides repair actions, such as displaying a visual notice to replace the specific faulty memory module or suggests reparative procedures. If no 335, then the flowchart 300 returns to sleep, at least until the next SBE is counted, because comparison of the counted SBEs for the particular user computer system is less than the set SBE value. Subsequent to the issuing 350 the alert with optional actions or no 335, the flowchart ends 375.

Figure 4:
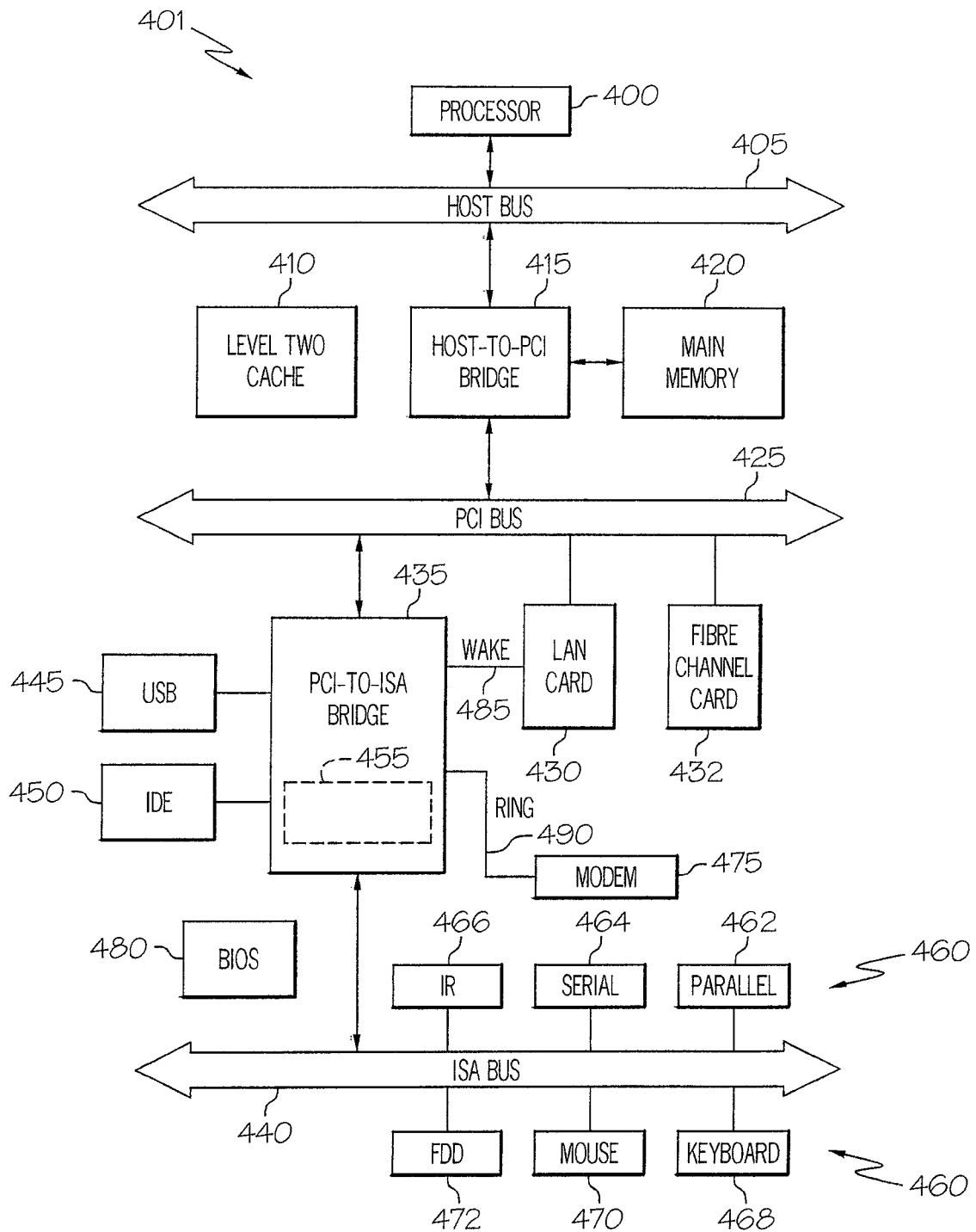
FIG. 4 depicts another diagram of an example embodiment of a computer system suitable for scalable predictive failure analysis, such as a user computer system.

FIG. 4 illustrates information handling system 401 which is a simplified example of a computer system, such as shown in FIG. 2 for use in scalable predictive failure analysis, and capable of performing the operations described herein. Computer system 401 includes processor 400 which is coupled to host bus 405. A level two (L2) cache memory 410 is also coupled to the host bus 405. Host-to-PCI bridge 415 is coupled to main memory 420, includes cache memory and main memory control functions, and provides bus control to handle transfers among PCI bus 425, processor 400, L2 cache 410, main memory 420, and host bus 405. As an alternative to the foregoing, the level 2 cache 410, memory controller and the north bridge may be integrated into the CPU; then, the system main memory is connected to the memory controller, which is inside the CPU. PCI bus 425 provides an interface for a variety of devices including, for example, LAN card 430. PCI-to-ISA bridge 435 provides bus control to handle transfers between PCI bus 425 and ISA bus 440, universal serial bus (USB) functionality 445, IDE device functionality 450, power management functionality 455, and can include other functional elements not shown, such as a real-time clock (RTC), DMA control, interrupt support, and system management bus support. Peripheral devices and input/output (I/O) devices can be attached to various interfaces 460 (e.g., parallel interface 462, serial interface 464, infrared (IR) interface 466, keyboard interface 468, mouse interface 470, fixed disk (HDD) 472, removable storage device 474) coupled to ISA bus 440. Alternatively, many I/O devices can be accommodated by a super I/O controller (not shown) attached to ISA bus 440.

BIOS 480 is coupled to ISA bus 440, and incorporates the necessary processor executable code for a variety of low-level system functions and system boot functions. BIOS 480 can be stored in any computer readable storage medium, including magnetic storage media, optical storage media, flash memory, random access memory, and read only memory. In order to attach computer system 401 to another computer system to copy files over a network, LAN card 430 is coupled to PCI bus 425 and to PCI-to-ISA bridge 435. Similarly, to connect computer system 401 to an ISP to connect to the Internet using a telephone line connection, modem 475 is connected to serial port 464 and PCI-to-ISA Bridge 435.

While the computer systems described in FIGS. 2 and 4 are capable of executing the disclosure described herein, these computer systems are simply examples of computer systems and user computer systems. Those skilled in the art will appreciate that many other computer system designs are capable of performing the disclosure described herein.

Another embodiment of the disclosure is implemented as a program product for use within a device such as, for example, those systems and methods depicted in FIGS. 1 and 3. The program(s) of the program product defines functions of the embodiments (including the methods described herein) and can be contained on a variety of media including but not limited to: (i) information permanently stored on non-volatile storage-type accessible media (e.g., write and readable as well as read-only memory devices within a computer such as ROM, flash memory, CD-ROM disks readable by a CD-ROM drive); (ii) alterable information stored on writable storage-type accessible media (e.g., readable floppy disks within a diskette drive or hard-disk drive); and (iii) information conveyed to a computer through a network. The latter embodiment specifically includes information downloaded onto either permanent or even sheer momentary storage-type accessible media from the World Wide Web, an internet, and/or other networks, such as those known, discussed and/or explicitly referred to herein. Such data-bearing media, when carrying computer-readable instructions that direct the functions of the present disclosure, represent embodiments of the present disclosure.

In general, the routines executed to implement the embodiments of this disclosure, may be part of an operating system or a specific application, component, program, module, object, or sequence of instructions. The computer program of this disclosure typically comprises a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of this disclosure. However, it should be appreciated that any particular program nomenclature that follows is used merely for convenience, and thus this disclosure should not be limited to use solely in any specific application identified and/or implied by such nomenclature.

While the foregoing is directed to example embodiments of this disclosure, other and further embodiments of this disclosure may be devised without departing from the basic scope thereof, and the scope thereof is determined by the claims that follow.

What is claimed is:

1. A method for scalable predictive failure analysis, the method comprising:
a processor gathering values for one or more characteristics of a memory of a computer system;
the processor selecting one or more memory-related parameters, each of the one or more memory-related parameters representing a different characteristic of the one or more characteristics of the memory, wherein the one or more memory-related parameters include a memory size parameter indicative of a capacity of the memory;
the processor calculating a scalable single bit error threshold value using the values for each of the one or more characteristics of the memory represented by the selected one or more memory-related parameters; and
the processor setting the calculated scalable single bit error threshold value for the memory.

2. The method of claim 1, further comprising the processor re-calculating the scalable single bit error threshold value for the memory subsequent to performance of a reparative procedure.

3. The method of claim 1, further comprising causing display of a notice in response to a determination that the calculated scalable single bit error threshold value has been met or exceeded.

4. The method of claim 1, wherein the one or more memory-related parameters include a memory rank parameter.

5. The method of claim 1, wherein the one or more memory-related parameters include a module packaging parameter indicative of whether the memory includes error checking and correcting (ECC) capability.

6. The method of claim 1, wherein the one or more memory-related parameters include a memory failure mode parameter indicative of how errors are counted for a correctable single bit error that occurs repeatedly at the same address of the memory.

7. The method of claim 1, wherein the one or more memory-related parameters include a vendor quality rating parameter.

8. A computer program product for scalable predictive failure analysis, the computer program product comprising:
a computer readable storage device;
program instructions, stored on the computer readable storage device, to gather values for one or more characteristics of a memory of a computer system;
program instructions, stored on the computer readable storage device, to select one or more memory-related parameters, each of the one or more memory-related parameters representing a different characteristic of the one or more characteristics of the memory, wherein the one or more memory-related parameters include a memory size parameter indicative of a capacity of the memory;
program instructions, stored on the computer readable storage device, to calculate a scalable single bit error threshold value using the values for each of the one or more characteristics of the memory represented by the selected one or more memory-related parameters; and
program instructions, stored on the computer readable storage device, to set the calculated scalable single bit error threshold value for the memory.

9. The computer program product of claim 8, wherein the one or more memory-related parameters include a memory rank parameter.

10. The computer program product of claim 8, wherein the one or more memory-related parameters include a module packaging parameter indicative of whether the memory includes error checking and correcting (ECC) capability.

11. The computer program product of claim 8, wherein the one or more memory-related parameters include a memory failure mode parameter indicative of how errors are counted for a correctable single bit error that occurs repeatedly at the same address of the memory.

12. The computer program product of claim 8, wherein the one or more memory-related parameters include a vendor quality rating parameter.

13. A system for scalable predictive failure analysis, the system comprising:

a processor, a computer readable memory and a computer readable storage device;

program instructions, stored on the computer readable storage device for execution by the processor via the computer readable memory, to gather values for one or more characteristics of a memory of a computer system;

program instructions, stored on the computer readable storage device for execution by the processor via the computer readable memory, to select one or more memory-related parameters, each of the one or more memory-related parameters representing a different characteristic of the one or more characteristics of the memory, wherein the one or more memory-related parameters include a memory size parameter indicative of a capacity of the memory;

program instructions, stored on the computer readable storage device for execution by the processor via the computer readable memory, to calculate a scalable single bit error threshold value using the values for each of the one or more characteristics of the memory represented by the selected one or more memory-related parameters; and program instructions, stored on the computer readable storage device for execution by the processor via the computer readable memory, to set the calculated scalable single bit error threshold value for the memory.

14. The system of claim 13, wherein the one or more memory-related parameters include a memory rank parameter.

15. The system of claim 13, wherein the one or more memory-related parameters include a module packaging parameter indicative of whether the memory includes error checking and correcting (ECC) capability.

16. The system of claim 13, wherein the one or more memory-related parameters include a memory failure mode parameter indicative of how errors are counted for a correctable single bit error that occurs repeatedly at the same address of the memory.

17. The system of claim 13, wherein the one or more memory-related parameters include a vendor quality rating parameter.

* * * * *